(12) United States Patent
Curatolo

(10) Patent No.: US 7,214,903 B2
(45) Date of Patent: *May 8, 2007

(54) MELTING AND VAPORIZING APPARATUS AND METHOD

(75) Inventor: Susana Curatolo, Lawrence, KS (US)

(73) Assignee: CZ Technologies, Inc., Lawrence, KS (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/284,819
(22) Filed: Nov. 23, 2005

(65) Prior Publication Data

US 2006/0076324 A1    Apr. 13, 2006

Related U.S. Application Data

(63) Continuation of application No. 10/751,946, filed on Jan. 7, 2004, which is a continuation-in-part of application No. 10/480,042, filed as application No. PCT/US02/32003 on Oct. 8, 2002, now Pat. No. 7,067,006.

(60) Provisional application No. 60/393,829, filed on Jul. 8, 2002.

(51) Int. Cl.
    *B23K 10/00*    (2006.01)
(52) U.S. Cl. .......................... 219/121.38; 219/121.59; 219/121.48; 156/345.42; 117/4; 117/930; 117/938
(58) Field of Classification Search .......... 219/121.59, 219/121.48, 121.36, 123, 121.41, 121.4; 156/345.42; 117/4, 938, 932; 315/111.21
See application file for complete search history.

(56) References Cited

U.S. PATENT DOCUMENTS

| 3,243,267 A | * | 3/1966 | Piper ........................... 117/109 |
| 4,738,831 A | | 4/1988 | Naumann et al. |
| 4,853,078 A | * | 8/1989 | Miyazaki ..................... 117/82 |
| 4,946,543 A | | 8/1990 | Kalisher et al. |

FOREIGN PATENT DOCUMENTS

| GB | 1591651 | 6/1981 |
| WO | 2004005203 | 1/2004 |

OTHER PUBLICATIONS

Onaga, L., "Fusion in a flash? Science Researchers Report Nuclear Emissions From Tiny, Super-Hot Collapsing Bubbles," American Association for the Advancement of Science (Mar. 4, 2002).

(Continued)

*Primary Examiner*—Mark Paschall
(74) *Attorney, Agent, or Firm*—Barnes & Thornburg LLP

(57) ABSTRACT

An apparatus and method for heating materials or substances in an oven at an oven temperature below their melting and/or vaporization points to either melt and/or vaporize the substance. Substances are inserted into a substantially spherical envelope. The envelope is sealed at a preset pressure. The solid is heated in an oven at an oven temperature substantially below the melting or vaporization temperature of the substance at the preset pressure for a time sufficient to either melt or vaporize the substance.

19 Claims, 3 Drawing Sheets

OTHER PUBLICATIONS

Dagani, R., "Hubbub Over 'Bubble Fusion': Much-Disputed Paper Offers Evidence Of Nuclear Fusion In A Tabletop Apparatus," Chemical & Engineering News, 80:10 (Mar. 11, 2002).

"Evidence Bubbles Over To Support Tabletop Nuclear Fusion Device," Purdue News (Mar. 2, 2004).

"Inertial-Confinement Fusion Driven By Pulsed Power Yields Thermonuclear Neutrons," Physics Today, pp. 19-21 (Jul. 2003).

"Units And Conversion Factors," http://www.chembio.uoguelph.ca/educmat/chm386/convfact.htm. (Jul. 10, 2003).

Bailey, J.E., et al., "Hot Dense Capsule Implosion Cores Produced by Z-Pinch Dynamic Hohlraum Radiation" (2003).

Smirnov, V.P., "Fast Liners for Inertial Fusion," Plasma Physics and Controlled Fusion, 33:13, pp. 1697-1714 (1991).

Evarestov, R.A., et al., "Symmetrical Transformation of Basic Translation Vectors in the Supercell Model of Imperfect Crystals and in the Theory of Special Points of the Brillouin Zone," J. Phys.: Condens. Matter 9, pp. 3023-3031 (1997).

Bailey, J.E., et al., "X-Ray Imaging Measurements of Capsule Implosions Driven by a Z-Pinch Dynamic Hohlraum," Physical Review Letters, 89:9, pp. 95004-1-095004-4 (Aug. 26, 2002).

Papka, P., et al., "Large Deformation Effects in the N=Z $^{44}$Ti Compound Nucleus," 10th International Conference on Nuclear Reaction Mechanisms, Varenna, Italy, Jun. 9-13, 2003.

Di Stefano, P.C.F., et al., "A Textured Silicon Calorimetric Light Detector," arXiv:physics/0307042 v1 (Jul. 7, 2003).

Vlasov, Yuril A. et al., "Active Control of Slow Light on a Chip with Photonic Crystal Waveguides," Nature 438, pp. 65-69, Nov. 3, 2005.

Krushelnick, K. et al., "Laser Plasma Interactions: Fast Ignition Experiments," Imperial College, London, Sep. 8, 2005.

Dangor, A. E. et al., "High Intensity Laser Interactions With Solids," Imperial College London, Sep. 2005.

Najmudin, Z., et al., "Laser Produced Plasmas as a Compact Particle Accelerator," Imperial College London, Sep. 2005.

Willi, O., et al., "Experimental Laser Plasma Interaction Studies," Imperial College London, Sep. 2005.

Davies, JR, et al., "Modeling of Short Laser Pulse Interactions with Solid Targets," Imperial College London, Sep. 2005.

Kodama, R., et al., "Plasma Devices to Guide and Collimate a High Density of MeV Electrons." Nature 432, 1005-1008, Dec. 23, 2004.

Tanaka, K. A. et al., "Progress and Perspectives of Fast Ignition," Plasma Physics and Controlled Fusion, 46, (2004), B41-B49, Dec. 2004.

Curatolo, S., "New Experimental Implications for ICF," 31st EPS Conference on Plasma Phys., 28G:P-2.002 (Jun. 28, 2004) XP002335904 London, Abstract.

McNab, Sharee J. et al., "Ultra-Los Lss Photonic Integrated Circuit With Membrane-Type Photonic Crystal Waveguides," Optic Express 11:22, pp. 2927-2939 Nov. 3, 2003.

Kodama, R. et al., "Nuclear Fusion: Fast Heating Scalable to Laser Fusion Ignition," Nature 418, 933-934 (Aug. 29, 2002).

\* cited by examiner

MELTING AND VAPORIZING APPARATUS AND METHOD

CROSS-REFERENCE

This application is a continuation of U.S. patent application Ser. No. 10/751,946, filed Jan. 7, 2004 which is a continuation-in-part of U.S. patent application Ser. No. 10/480,042, filed Dec. 9, 2003 now U.S. Pat. No. 7,067,006, which is a nationalization of PCT/US02/32003, filed Oct. 8, 2002, which claims priority and benefit of U.S. Provisional Application 60/393,829 filed Jul. 8, 2002. The provisional application and the national PCT application are incorporated herein by reference.

BACKGROUND AND SUMMARY OF THE DISCLOSURE

The present disclosure relates generally to heating materials and, more specifically, to heating materials with respect to their melting and vaporization points or temperatures.

Solid materials or substances must be heated in many processes to create liquids or gases. These are used to create compounds of the materials and/or to create vapors for depositions. The cost related to the process is an initial function of the equipment necessary to perform the heating and, secondly, the amount of energy that must be used to convert a solid into a liquid or a solid or liquid into a vapor. After the initial cost of the equipment, continued savings can be achieved if the temperature to convert a solid to a liquid or a vapor or the temperature to convert a liquid to a vapor can be reduced. There will be significant savings if this temperature can be reduced substantially below the melting point for melting or a vaporization point for vaporizing.

The present disclosure is directed to an apparatus and method for heating materials or substances in an oven at an oven temperature below their melting and/or vaporization points to either melt and/or vaporize the substance. Substances are inserted into a substantially spherical envelope. The envelope is sealed at a preset pressure. The solid is heated in an oven at an oven temperature substantially below the melting or vaporization temperature of the substance at the preset pressure for a time sufficient to either melt or vaporize the substance.

The envelope is shaped so as to create an electron vortex of electrons or a plasma flow of electrons emitted from the substance. The heating at the oven temperature generates electron emissions from the substance and creates the electron vortex or the plasma flow, which allows melting or vaporization of the substance at the oven temperature below the melting or vaporization temperature at the preset pressure. The electron vortex or plasma flow creates a magnetic confinement field without external excitement. The electron vortex or plasma flow also accelerates the emission of electrons in the substance, which increases the heat of the substance above that of the oven temperature.

The substantially spherical envelope structure can also be used in a coating method wherein the substance and a substrate to be coated are inserted into the substantially spherical envelope. The envelope is sealed at a preset pressure and heated in the oven at an oven temperature below the vaporization temperature of the substance at the preset pressure and for a time sufficient to vaporize the substance. The heat in the oven is reduced to deposit the vapors on the substrate. The substrate may be one of metal and ceramic. The substantially spherical envelope may be tear-, ovoid- or elliptically-shaped.

These and other aspects of the present disclosure will become apparent from the following detailed description of the disclosure, when considered in conjunction with accompanying drawings.

DETAILED DESCRIPTION OF THE PREFERRED EMBODIMENTS

The presently disclosed process and apparatus effectively melts or vaporizes a material or substance using substantially less energy than before. The material is melted and/or vaporized at an oven temperature below the melting and/or vaporization temperature of the substance. Thus, substantial energy savings are produced. The vaporized material may be used for vapor deposition processes.

Figure 1A:
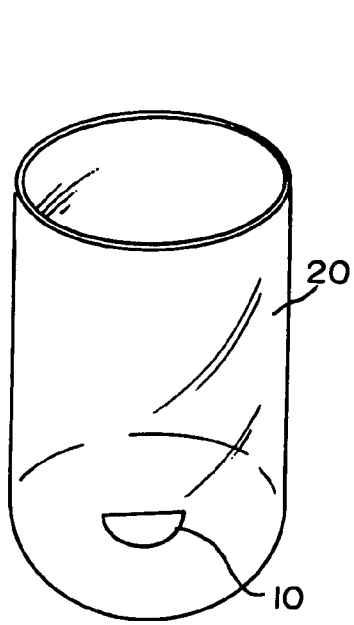
FIGS. 1A–1C show the process of enclosing the material in an envelope according to the present disclosure.
Figure 1B:
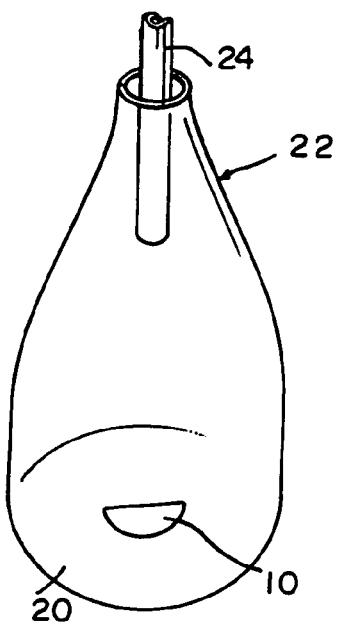
Figure 1C:
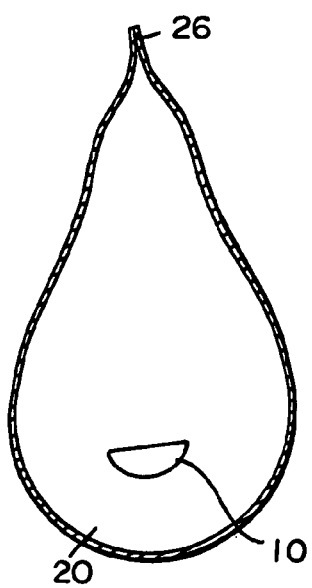
Figure 2:
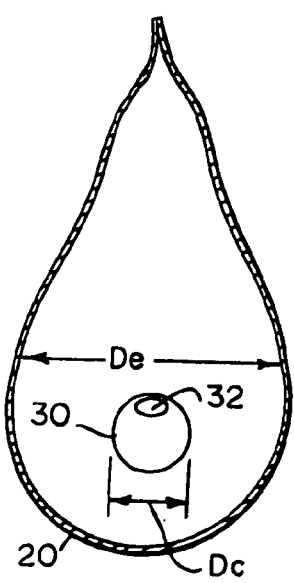
FIG. 2 shows a dual enclosure according to the present disclosure.
Figure 3:
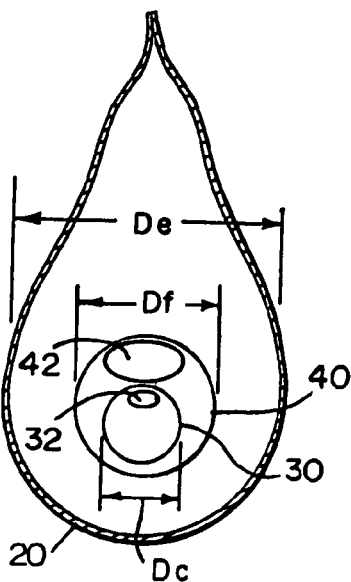
FIG. 3 shows a triple enclosure device according to the present disclosure.

An example of the apparatus is illustrated in FIGS. 1–3. A material 10 is placed in an envelope 20, as illustrated in FIG. 1A. The envelope 20 is neck down at 22 and receives a tube 24, as shown in FIG. 1B. The interior of the envelope 20 is evacuated. The tube 24 is removed from the envelope 20, and it is sealed at 26, as shown in FIG. 1C. The resulting structure is a generally spherical shape which resembles a tear drop, an ovoid or an ellipse. The processing of the envelope 20 to form the neck down 22 and closing it at 26 is performed with heat in a two-step method and sufficiently slow as not to preheat or affect the material 10 in the envelope 20. The envelope 20 may be quartz, for example.

Although the results to be described below have been achieved with a single envelope 20, the results can be further improved by using multiple enclosures. As illustrated in FIG. 2, a spherical crucible 30 having an opening 32 to receive the material or substance 10 is placed within the envelope 20. As an example, the crucible 30 may be a ball or sphere having a diameter Dc of approximately 12 millimeters. The resulting envelope 20 may have a diameter De of approximately 22 millimeters and a height of 50.8 millimeters. The thickness of the envelope 20 may be approximately 1 millimeter.

A triple enclosure device is illustrated in FIG. 3. The crucible 30 is enclosed in an enclosure 40 having an opening 42. The enclosure 40 is inserted in the envelope 20 and sealed therein. The openings 32, 42 allow vapors from the material 10 in the crucible 30 to flow into the envelope 20 during the process. As an example, the crucible 30 will have a diameter Dc of approximately 12 millimeters, the enclosure 40 will have a diameter Df of approximately 22 millimeters, and the envelope 20 will have a diameter De of approximately 44 millimeters.

Figure 4:
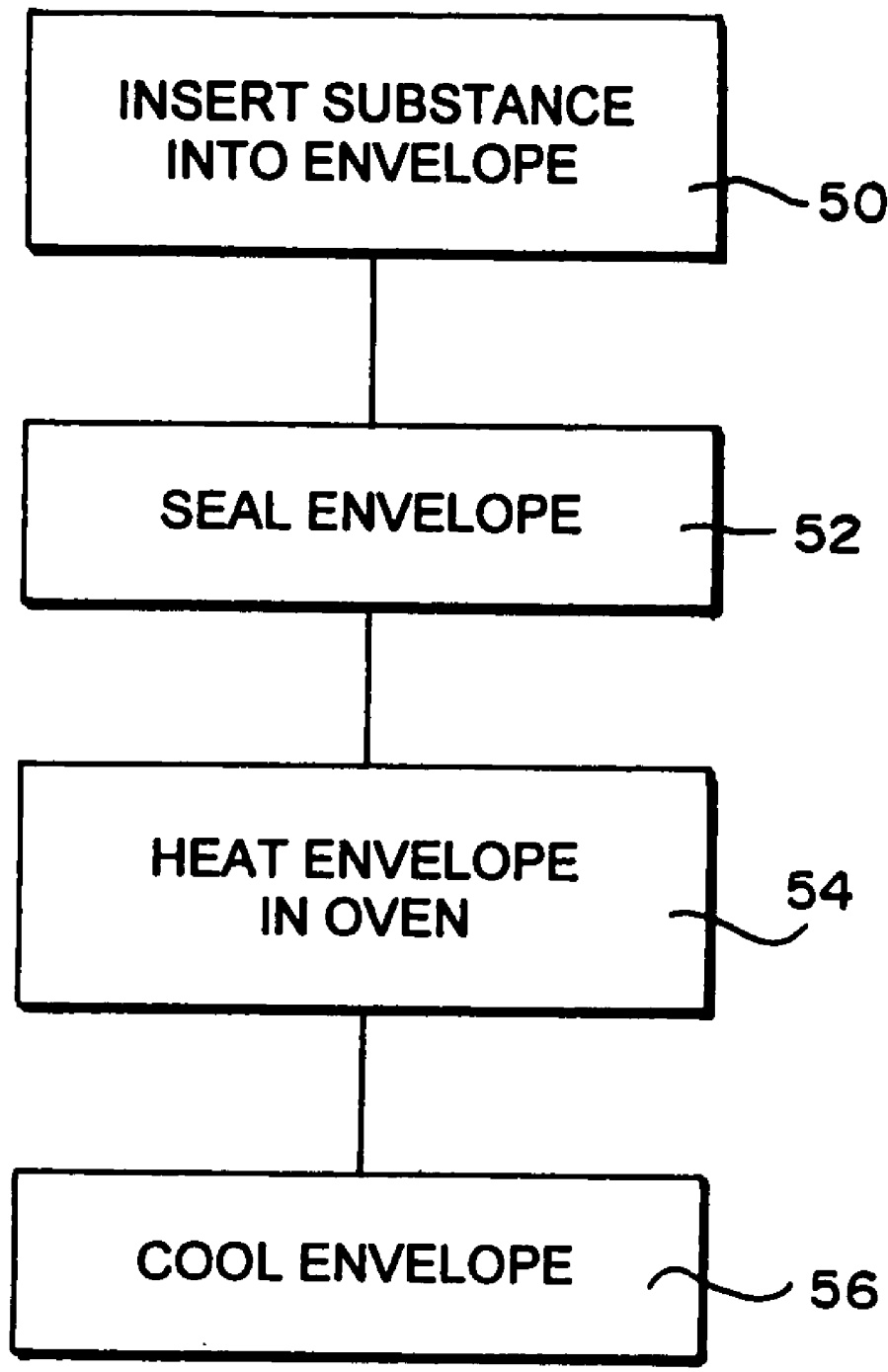
FIG. 4 shows a flow chart of a process according to the present disclosure.

Envelope 20 with substance 10 by itself or with a crucible 30, or crucible 30 and enclosure 40, is then inserted into an oven. It is heated at an oven temperature and time sufficient to melt or vaporize the substance 10. The oven temperatures to melt and/or vaporize are below the melt and/or vaporization temperature of the material. The general process is described in FIG. 4. The substance 10 is inserted into the envelope 20 at step 50. The envelope 20 is sealed at step 52, and the envelope 20 is heated in an oven at step 54. The envelope 20 is then cooled at 56.

More than one substance is provided in the envelope 20. A compound is created of the two substances. If a substrate is inserted in the envelope 20 and the substrate is not vaporized by the process, the vaporization of the substance will then deposit on the substrate upon cooling.

Experiments were run using the single enclosure of FIG. 1 and the triple enclosure of FIG. 3. In the case of tellurium, silicon and gold, 0.1 grams of each were used. The results are shown in Table 1 below. For each of the substances or materials, the oven temperature was substantially below the vaporization point temperature for the material and below the melting point temperature. The oven temperature was set and/or the temperatures measured were between 30 and 40 percent of the vaporization temperature. For the tellurium, the 325° C. represents about 32.8 percent of the vaporization temperature, the 1080° C. for silicon represents about 33 percent of the vaporization temperature, the 965° C. for copper represents about 37.6 percent of the vaporization temperature and the 1025° C. for gold represents about 35.3 percent of the vaporization temperature.

field were introduced into the envelope 20 from external the envelope 20. From the observed behavior and results, the source of this additional energy is electrons emitted from the solid.

Figure 5:
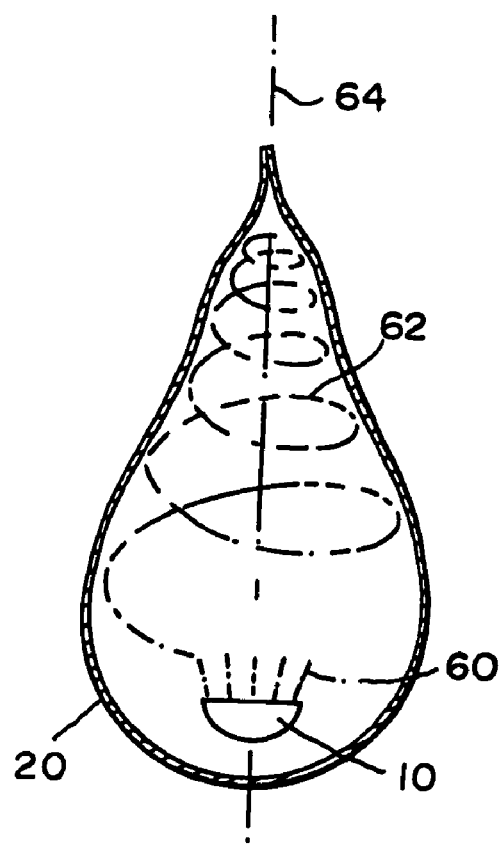
FIG. 5 is a diagram illustrating electron vortex or plasma flow according to the present disclosure.

Electrons are emitted from solid through the known Einstein Photo-electric Effect. These electrons are illustrated at 60 in FIG. 5. Due to the shape of the envelope 20, these electrons create a vortex flow within the envelope 20. This electron vortex is also considered a plasma flow. This motion of the electrons or plasma generates a magnetic field of energy. This magnetic field creates a magnetic enforcement field at the interior surface of the envelope 20 without external excitation. The energy of the magnetic field accelerates the release of electrons from the solid, thereby increasing the solid body temperature beyond its melting point. Thus, the solid may pass into a liquid stage below its melting point. Once in the liquid stage, the electron vortex or plasma flow and the resulting electromagnetic field also causes the liquid to vaporize into a gas substantially below its vaporization temperature. As noted in Table 1 above, the vaporization is at an oven temperature below the melting point of the material 10.

The additional heating within the substance results from the increased lattice vibrations experienced by the interatomic and intra-atomic bonds. The electron vortex is a product of the electrons trying to come into equilibrium with the fixed volume of the envelope 20. This volume, in combination with the magnetic field, forms the magnetic

TABLE 1

| Material | No. of Encls. | Melting Point | Vaporization Point | Oven Temp. | Duration | Results |
|---|---|---|---|---|---|---|
| TE | 3 | 450° C. | 990° C. | 325° C. | 5 hours | Total vapor @ 42 min. |
| TE | 1 | 450° C. | 990° C. | 325° C. | 5 hours | Partial vapor |
| CU | 3 | 1083° C. | 2566° C. | 930° C. | | Partial vapor |
| | | | | 965° C. | 5 hours | Total vapor |
| SI | 3 | 1414° C. | 3265° C. | 945° C. | 1 hour | |
| | | | | 1050° C. | 1/2 hour | Partial vapor |
| | | | | 1080° C. | 2 1/4 hours | Total vapor |
| AU | 1 | 1064° C. | 2900° C. | 1025° C. | 5 hours | Total vapor |

For the silicon, the sample was cooked for one hour at 945° C. for one hour and then set for 1150° C. The other times listed are the elapse time from the change of setting and the observed results. It should be noted that some material (for example, fused quartz gauze) was used in the envelope 20 and in the opening 32 of crucible 30 to maintain the material or substance 10 in place during assembly and handling.

It should be noted that at various temperatures during ramp up to the final oven temperature for tellurium and gold using a single enclosure, the pyrometer of the oven registered temperature spikes or overshoots. For example, for the tellurium, the temperature increase was measured at 80° C. above the setting of the oven. For the gold, the spike or overshoot was 300° C.

The tapered shape of the enclosures, envelopes and/or crucibles produce the improved results. Experiments conducted with more spherical enclosures produces just partial vaporization and then only at the outermost enclosure at its very small end taper where it was closed.

Figure 6:
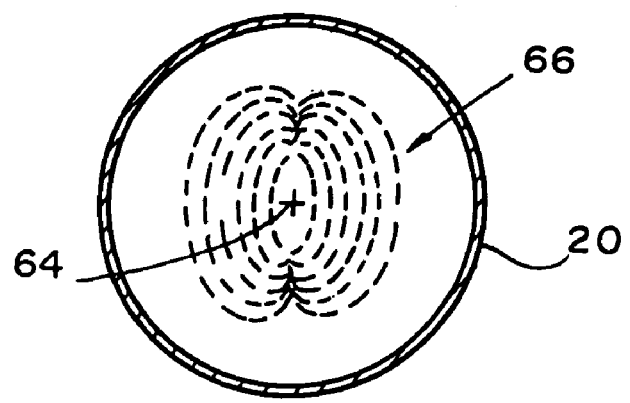
FIG. 6 is a top view showing a dipole produced according to the present disclosure.

The solids 10 inserted into the uniquely-shaped envelope 20, whether by itself or with additional crucibles or enclosures, produced results at oven temperatures below that of the melting and vaporization temperature for the material. To achieve this result, there is an additional energy source within the envelope 20. No charges or any other magnetic confinement field. The magnetic field is parallel to the axis 61 of the vortex and the envelope 20. The magnetic field penetrates all that is contained in the volume including the material 10 at the bottom. Due to Lorentz forces on each of the emitted electrons moving in the vortex, additional energy is generated greater than that generated by the heat flow. FIG. 6 illustrates a dipole field 66 observed looking down the axis 64 of the magnetic field.

Based on observations, the above explanation is an interpretation of what produces the additional energy. There may be other effects which produce the energy by themselves or in addition to the above explanation. The present process is not to be limited by the supposition of where the additional energy is coming from other than that it is not coming from outside of the envelope 20 other than the heat from the oven.

Figure 7:
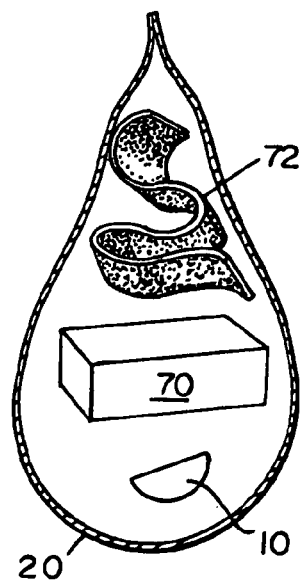
FIG. 7 is a sealed enclosure for a vapor deposition process according to the present disclosure.

The present structure and process may be used for vapor deposition. As illustrated in FIG. 7, a substrate 70 may be placed in the envelope 20 with the material 10. It should be noted that some material 72 (for example, fused quartz gauze) was used in the envelope 20 to maintain the material 10 and substance 70 in place during assembly and handling. The envelope 20 is then vacuumed and sealed. The envelope 20 with the material 10 and the substrate 70 are then heated at a temperature substantially below the vaporization temperature of the material 10. Once the material 10 is totally vaporized, the oven is shut off, and the vapors are allowed to deposit upon the substrate. Although a single substance 10 is shown, the substance 10 may be two or more substances which, in a vapor state, form a combined compound as the coating.

For example, a substrate 70 may be coated with a compound formed from silicon and tellurium. For example, 21 grams of a metal substrate and 2 grams of the silicon/tellurium compound may be provided in the envelope 20. The envelope 20 with the material 10 and the substrate 70 are then heated at 999° C. for 5 hours and then cooled. The resulting product forms a coating of $SiO_2Te_x$, where x is in the range of 1/3 to 5/3. As described in the parent application, this single crystalline structure of silicon dioxide and tellurium is hydroxyl ion and hydrogen resistant. This is beneficial, as described therein, for making, doping and coating optical fibers. It is also found to substantially resist acid corrosion of metal since all acids include or will react in an environment to produce hydroxyl ions.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed:

1. A method of creating a magnetic confinement field, the method comprising:
   providing a tapered structure, which is tapered over a substantial portion of its length, in an envelope to create an electron vortex;
   providing a substance in the envelope adjacent the tapered structure; and
   heating the substance with energy to produce a temperature below the vaporizing temperature of the substance and for a time sufficient to generate electron emissions within the envelope and create the electron vortex which creates the magnetic confinement field.

2. The method of claim 1, wherein the tapered structure is the interior of the envelope.

3. The method of claim 1, wherein the substance is distinct from the tapered structure.

4. The method of claim 3, wherein the tapered structure is the interior of the envelope.

5. The method of claim 3, wherein the substance is distinct from the tapered structure.

6. A method of creating a magnetic confinement field, the method comprising:
   providing a tapered structure, which is tapered over a substantial portion of its length, in an envelope to create a plasma flow;
   providing a substance in the envelope adjacent the tapered structure; and
   heating the substance with energy to produce a temperature below the vaporizing temperature of the substance and for a time sufficient to generate electron emissions within the envelope and create the plasma flow which creates the magnetic confinement field.

7. A method of melting a solid at temperature below the melting temperature of the solid at a preset pressure, the method comprising:
   inserting the solid into a tapered envelope which is tapered over a substantial portion of its length;
   scaling the envelop at the preset pressure; and
   heating the solid in an oven at an oven temperature substantially below the melting temperature of the solid at the preset pressure and for a time sufficient to melt the solid.

8. A method of vaporizing a substance at temperature below the vaporizing temperature of the substance at a preset pressure, the method comprising:
   inserting the substance into a tapered envelope which is tapered over a substantial portion of its length;
   sealing the envelope at the preset pressure; and
   heating the substance at a temperature below the vaporizing temperature of the substance at the preset pressure and for a time sufficient to vaporize the substance.

9. A method of vaporizing a substance at temperature below the vaporizing temperature of the substance at a preset pressure, the method comprising:
   providing a tapered structure, which is tapered over a substantial portion of its length, in an envelope to create a plasma flow;
   inserting the substance into an envelope adjacent the tapered structure;
   sealing the envelope at the preset pressure; and
   heating the substance with energy to produce a temperature below the vaporizing temperature of the substance at the preset pressure and for a time sufficient to generate electron emissions within the envelope and create the plasma flow which allows vaporization of the substance at the applied energy produced temperature below the vaporizing temperature of the substance at the preset pressure.

10. The method of claim 9, wherein the tapered structure is the interior of the envelope.

11. The method of claim 9, wherein the plasma flow creates a magnetic confinement field without external excitement.

12. The method of claim 9, wherein the plasma flow accelerates the emission of electrons in the substance which increases the heat of the substance above that of the heating temperature.

13. The method of claim 9, wherein the temperature is below the melting temperature of the substance at the preset pressure.

14. The method of claim 9, wherein the heating temperature is between 30% and 40% of the vaporizing temperature of the substance at the preset pressure.

15. The method of claim 9, wherein the preset pressure is substantially a vacuum.

16. The method of claim 9, wherein the envelope is tear-shaped.

17. The method of claim 9, wherein the envelope is ovoid-shaped.

18. A method of coating a substrate with a substance at temperature below the vaporizing temperature of the substance at a preset pressure, the method comprising:
   inserting the substance and the substrate into an envelope to create an electron vortex;
   sealing the envelope at the preset pressure;
   heating the substance at a temperature below the vaporizing temperature of the substance at the preset pressure and for a time sufficient to vaporize the substance, generate electron emission and create the electron vortex; and
   reducing the heat in the oven to deposit the vapors on the substrate.

19. The method according to claim 18, wherein the substrate is one of metal and ceramic.

* * * * *